(12) United States Patent
Marie

(10) Patent No.: US 8,290,108 B2
(45) Date of Patent: Oct. 16, 2012

(54) PHASE LOCKED LOOP CALIBRATION

(75) Inventor: Herve Marie, Ver sur Mer (FR)

(73) Assignee: ST-Ericsson SA, Plan-les-Ouates (CH)

( * ) Notice: Subject to any disclaimer, the term of this patent is extended or adjusted under 35 U.S.C. 154(b) by 879 days.

(21) Appl. No.: 12/357,918

(22) Filed: Jan. 22, 2009

(65) Prior Publication Data

US 2009/0190709 A1 Jul. 30, 2009

(30) Foreign Application Priority Data

Jan. 22, 2008 (EP) .................... 08100724

(51) Int. Cl.
H03D 3/24 (2006.01)
(52) U.S. Cl. ...................................... 375/376
(58) Field of Classification Search .................. 375/373, 375/374, 375, 376, 269, 279; 331/10, 16
See application file for complete search history.

(56) References Cited

U.S. PATENT DOCUMENTS

| | | |
|---|---|---|
| 6,515,553 B1 | 2/2003 | Filiol et al. |
| 6,670,861 B1 | 12/2003 | Balboni |
| 2006/0033582 A1* | 2/2006 | Staszewski et al. ............. 331/16 |
| 2007/0103240 A1* | 5/2007 | Staszewski et al. ............. 331/16 |
| 2009/0102564 A1* | 4/2009 | Ballantyne ..................... 331/10 |

FOREIGN PATENT DOCUMENTS

| | | |
|---|---|---|
| WO | 2004034564 A2 | 4/2004 |
| WO | 2007013240 A1 | 1/2007 |

OTHER PUBLICATIONS

Bopp et al., "A DECT Transceiver Chip Set Using SiGe Technology," IEEE International Solid State Circuit Conference, Feb. 1999, pp. 68-69.
Straszewski et al., "Just-In-Time Gain Estimation of an RF Digitally-Controlled Oscillator for Digital Direct Frequency Modulation," IEEE Transactions on Circuits and Systems, 50(11):887-892, Nov. 2003.
Lee et al., "A Quad-Band GSM-GPRS Transmitter With Digital Auto-Calibration," IEEE Journal of Solid-State Circuits, 39(12):2200-2214, Dec. 2004.
Straszewski et al., "LMS-Based Calibration of an RF Digitally Controlled Oscillator for Mobile Phones," IEEE Transactions on Circuits and Systems, 53(3):225-229, Mar. 2006.
Extended European Search Report, dated Jan. 2, 2012, in connection with European Patent Application No. 09000654.5.
McMahill, D.R. et al. "A 2.5-Mb/s GFSK 5.0Mb/s 4-FSK Automatically Calibrated Frequency Synthesizer", IEEE Journal of Solid-State Circuits, IEEE Service Center, Piscataway, NJ, USA, vol. 37, No. 1, Jan. 1, 2002, XP011061675, ISSN: 0018-9200.

* cited by examiner

*Primary Examiner* — Jaison Joseph
(74) *Attorney, Agent, or Firm* — Potomac Patent Group PLLC

(57) ABSTRACT

A method for controlling a modulation signal for modulating a phase locked loop. A scaling control signal for scaling the modulation signal is generated using the error signal of the phase locked loop. The scaling control signal is adjusted when the modulation signal and the phase of the modulation signal have the same sign.

26 Claims, 6 Drawing Sheets

PHASE LOCKED LOOP CALIBRATION

BACKGROUND

1. Technical Field

This disclosure relates to an apparatus and method for controlling a modulation signal for modulating a phase locked loop.

2. Description of the Related Art

Phase locked loops have a variety of applications, for example in frequency generation in wireless communication equipment. A basic phase locked loop comprises a variable frequency oscillator whose frequency and phase is controlled by an error signal, the error signal being generated by a phase detector that compares the phase of the oscillator output signal with the phase of a reference signal. The loop contains a low pass filter for filtering the error signal before it is applied to control the oscillator. Typically the oscillator operates at a higher frequency than the reference signal, and the loop includes a divider for dividing the oscillator output signal, such that the phase detector compares the divided signal with the reference signal.

The loop performance depends, among other things, on the gain of the oscillator, the gain being a measure of the change of oscillator frequency in response to a change in the error signal. As the oscillator is typically an analogue circuit, the loop performance is susceptible to variations in analogue circuit characteristics, due to, for example, temperature or voltage changes or manufacturing process spread, which lead to variations in oscillator gain.

In a wireless transmitter, in which a carrier signal is modulated by a modulation signal, it can be advantageous to apply the modulation to a phase locked loop, rather than to a mixer which would entail an additional RF circuit. A modulation signal can be applied to the input of the oscillator and/or used to control the division ratio of the divider. Schemes in which the modulation signal is applied to both the oscillator and the divider are known as two-point modulation schemes. However, variations in oscillator gain will lead to variations in the modulated carrier signal. In particular, if the oscillator gain is ideal, the transfer function for the modulation from the input of the oscillator to the output of the phase locked loop, that is the output of the oscillator, is an all-pass filter. However, if the oscillator gain is too high, high frequencies of the modulation signal are amplified too much, and if the oscillator gain is too low, high frequencies of the modulation signal are amplified too little.

Therefore, it is desirable to provide a way of calibrating a phase locked loop to compensate for variations in oscillator gain. Such calibration can be performed by scaling the modulation signal applied to the input of the oscillator. Successful calibration requires appropriate control of the degree of scaling.

WO 2004/034564 discloses a scheme for calibrating oscillator gain in which a correction signal is derived from a phase error signal, and in which the polarity of the error signal is measured by correlating the error signal with a modulation signal.

US 2007/0103240 discloses a scheme for gain calibration of a digitally controlled oscillator in which a phase error signal is sampled, either continuously or when zero crossings occur in an input data frequency control word, a gradient is generated from the samples and by using the sign of the data, and the oscillator gain estimate is adjusted in accordance with the gradient.

BRIEF SUMMARY

According to an embodiment there is provided an apparatus for controlling a modulation signal for modulating a phase locked loop, the phase locked loop providing an error signal indicative of a phase error in the phase locked loop, the apparatus comprising:

a scaling controller for generating a scaling control signal dependent on the error signal for controlling scaling of the modulation signal; and a sign detector for generating an indication of whether the sign of the modulation signal relative to a first threshold value and the sign of the phase of the modulation signal relative to a second threshold value are the same;

wherein the scaling controller is adapted to adjust the scaling control signal in response to the indication.

In an embodiment the scaling controller is adapted to adjust the scaling control signal only when the modulation signal and the phase of the modulation signal have the same sign. In an embodiment, the sign detector comprises: a first comparator for generating a first bipolar signal indicative of the sign of the modulation signal relative to the first threshold value; a second comparator for generating a second bipolar signal indicative of the sign of the phase of the modulation signal relative to the second threshold value; and a summer for generating said indication by summing the first bipolar signal and the second bipolar signal. In an embodiment, the sign detector comprises phase determination stage for determining a phase signal indicative of the phase of the modulation signal. In an embodiment, the sign detector comprises a delay stage for delaying at least one of the first bipolar signal and the second bipolar signal. In an embodiment, the sign detector comprises a first filter arranged to filter at least one of the modulation signal and a phase signal indicative of the phase of the modulation signal. In an embodiment, the scaling controller comprises: a third comparator for generating a third bipolar signal indicative of the sign of the error signal relative to a third threshold value; and a multiplier for multiplying the third bipolar signal by said indication. In an embodiment, the scaling controller comprises a first scaling stage coupled to an output of the multiplier for controlling the magnitude of the scaling control signal. In an embodiment, the scaling controller comprises a second filter coupled to an output of the first scaling stage. In an embodiment, the scaling controller comprises a third filter for filtering the error signal. In an embodiment, the apparatus further comprises a second scaling stage for scaling the modulation signal in response to the scaling control signal.

According to an embodiment there is provided a method for controlling a modulation signal for modulating a phase locked loop, the phase locked loop providing an error signal indicative of a phase error in the phase locked loop, the method comprising: generating a scaling control signal dependent on the error signal for controlling scaling of the modulation signal; generating an indication of whether the sign of the modulation signal relative to a first threshold value and the sign of the phase of the modulation signal relative to a second threshold value are the same; and adjusting the scaling control signal in response to the indication.

An embodiment calibrates a variable frequency oscillator of a phase locked loop by adjusting of the scaling of a modulation signal dependent on the modulation signal and the phase of the modulation signal having the same sign.

An embodiment may operate during normal operation of a phase locked loop without requiring dedicated time periods for calibration or a dedicated modulation signal. An embodiment may be independent of the spectral content of the modulation signal, such that different modulation signals can be applied without having to redesign the calibration scheme to ensure stability. This is beneficial in current communication environments where manufacturers of communications equipment are seeking to provide multi-mode equipment capable of operating in accordance with a variety of communication standards such as GSM, Bluetooth™, DECT, and UMTS. Furthermore, an embodiment may readily be implemented in either analog or digital hardware or in software.

An embodiment may be implemented in computer software or computer program code adapted to carry out embodiments of the methods when executed by a processor.

Optionally, in an embodiment the scaling controller may be adapted to adjust the scaling control signal only when the modulation signal and the phase of the modulation signal have the same sign. Correspondingly, in an embodiment the method may comprise adjusting the scaling control signal only when the modulation signal and the phase of the modulation signal have the same sign. This may reduce the likelihood of erroneous adjustment.

Optionally, in an embodiment the sign detector may comprise a first comparator for generating a first bipolar signal indicative of the sign of the modulation signal, a second comparator for generating a second bipolar signal indicative of the sign of the phase of the modulation signal, and a summer for generating said indication by summing the first bipolar signal and the second bipolar signal. This provides a way of determining when the modulation signal and the phase of the modulation signal have the same sign.

Optionally, in an embodiment the sign detector may comprise phase determination stage for determining a phase signal indicative of the phase of the modulation signal. The phase of the modulation signal may be determined by the apparatus.

Optionally, in an embodiment the sign detector may comprise a delay stage for delaying at least one of the first bipolar signal and the second bipolar signal. This facilitates compensation for a time difference between the first and second bipolar signals, or compensation for delay between controlling the modulation signal in the apparatus and the response of a phase locked loop to which the apparatus is coupled to the modulation signal.

Optionally, in an embodiment the sign detector may comprise a first filter arranged to filter at least one of the modulation signal and a phase signal indicative of the phase of the phase of the modulation signal. This may provide delay and/or noise reduction.

Optionally, in an embodiment the scaling controller may comprise a third comparator for generating a third bipolar signal indicative of the sign of the error signal relative to a third threshold value, and a multiplier for multiplying the third bipolar signal by said indication. This provides a way of controlling when scaling adjustment may take place.

Optionally, in an embodiment the scaling controller may comprise a first scaling stage coupled to an output of the multiplier for controlling the magnitude of the scaling control signal. In this way the magnitude of the scaling control signal is dependent on the sign of the error signal, the sign of the modulation signal and the sign of the phase of the modulation signal.

Optionally, in an embodiment the scaling controller may comprise a second filter coupled to an output of the first scaling stage. This facilitates smoothing of the scaling control signal.

Optionally, in an embodiment the scaling controller may comprise a third filter for filtering the error signal. This facilitates noise reduction of the error signal.

Optionally, in an embodiment the apparatus may comprise a second scaling stage for scaling the modulation signal in response to the scaling control signal. Scaling of the modulation signal may be incorporated into the apparatus.

An embodiment also provides a phase locked loop as described herein, a variable frequency oscillator for generating an oscillator signal at an oscillator frequency, a phase comparator for generating the error signal indicative of a phase difference between the oscillator signal and a reference signal, a loop filter for filtering the error signal to provide a filtered error signal, and a coupling stage for coupling the modulation signal, scaled in response to the scaling control signal, in combination with the filtered error signal to the oscillator for controlling the oscillator frequency.

In an embodiment, the phase locked loop may comprise a divider for dividing the oscillator signal, in which case the error signal may be indicative of a phase difference between the divided oscillator signal and a reference signal.

Such a phase locked loop may be adapted for single-point modulation of the oscillator, or for two-point modulation in which also the divider is adapted to divide the oscillator signal using a variable division ratio, the divider comprising an input for varying the division ratio in response to the phase of the modulation signal.

In such a phase locked loop, the delay introduced by the delay stage of the sign detector may correspond to a delay between a change in the modulation signal and a consequent change in the error signal. In this way, any difference between the delay in controlling the modulation signal in the apparatus and the response time of the phase locked loop to the modulation signal can be fully or partially compensated for.

An embodiment also provides a wireless communication device comprising a phase locked loop and an apparatus according to the embodiments described herein.

In an embodiment a phase locked loop comprises: an apparatus configured to generate a modulation signal; a variable frequency oscillator for generating an oscillator signal at an oscillator frequency; a phase comparator for generating the error signal indicative of a phase difference between the oscillator signal and a reference signal; a loop filter for filtering the error signal to provide a filtered error signal; and a coupling stage for coupling the modulation signal, scaled in response to the scaling control signal, in combination with the filtered error signal to the variable frequency oscillator for controlling the oscillator frequency. In an embodiment, the phase locked loop comprises a divider for dividing the oscillator signal, and wherein the error signal is indicative of a phase difference between the divided oscillator signal and a reference signal. In an embodiment the divider is adapted to divide the oscillator signal using a variable division ratio, and the divider comprises an input for varying the division ratio in response to the phase of the modulation signal. In an embodiment, a delay introduced by a delay stage corresponds to a delay between a change in the modulation signal and a consequent change in the error signal. In an embodiment, a wireless communication device comprises a phase locked loop as described herein.

In an embodiment, a method for controlling a modulation signal for modulating a phase locked loop, the phase locked loop providing an error signal indicative of a phase error in the phase locked loop, comprises: generating a scaling control signal dependent on the error signal for controlling scaling of the modulation signal; generating an indication of whether the sign of the modulation signal relative to a first threshold value and the sign of the phase of the modulation signal relative to a second threshold value are the same; and adjusting the scaling control signal in response to the indication. In an embodiment, the method comprising adjusting the scaling control signal only when the modulation signal and the phase of the modulation signal have the same sign. In an embodiment, a computer program code is adapted to perform the method when executed by a processor.

BRIEF DESCRIPTION OF THE SEVERAL VIEWS OF THE DRAWINGS

Embodiments will now be described, by way of example only, with reference to the accompanying drawings in which.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
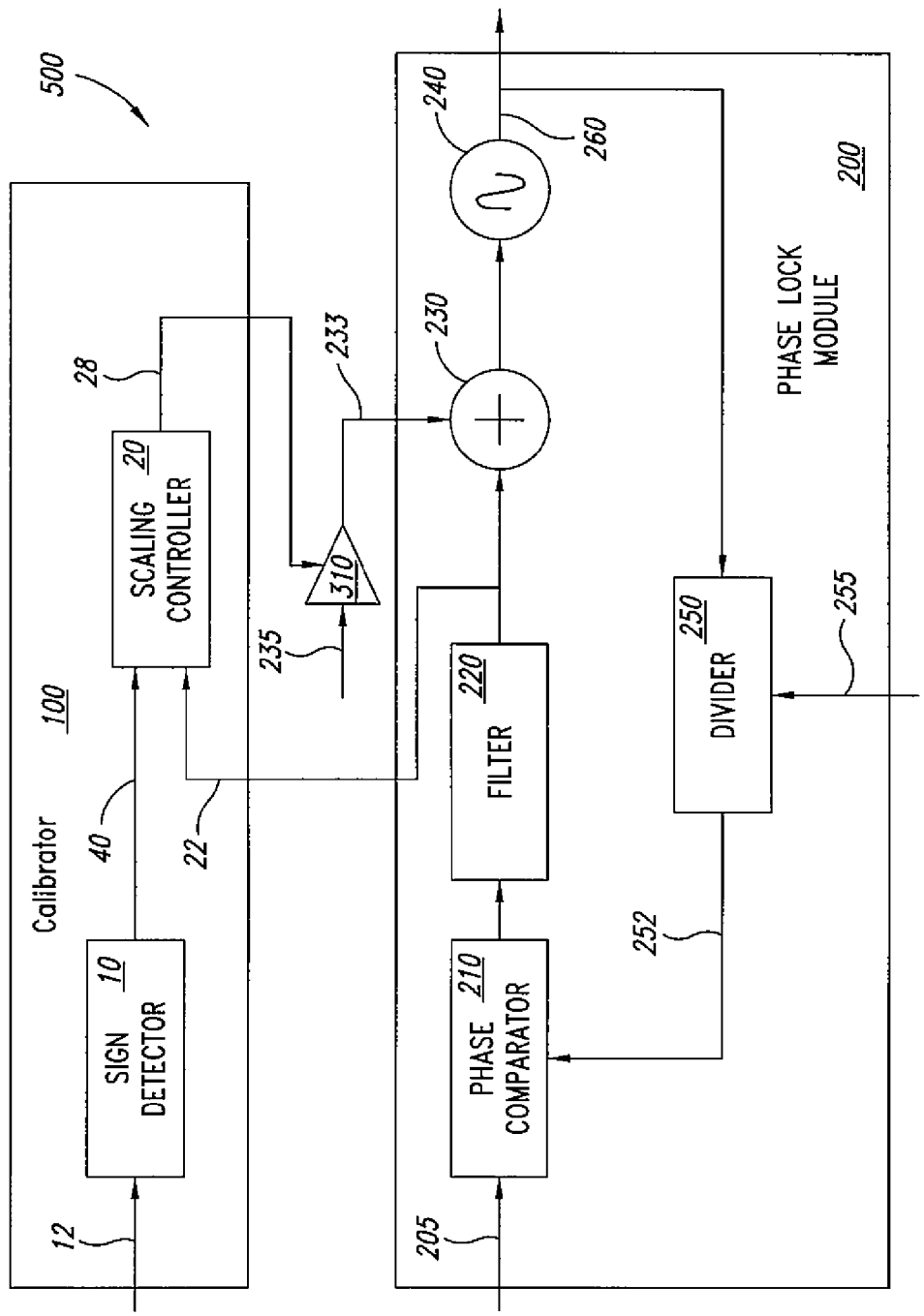
FIG. 1 is a block schematic diagram of a phase locked loop comprising a calibrator in accordance with an embodiment coupled to a phase lock module.

Referring to FIG. 1, there is illustrated a phase locked loop 500 in accordance with an embodiment comprising a calibrator 100 and a phase lock module 200. The phase lock module 200 may be, for example, a conventional phase locked loop.

Describing first the phase lock module 200, it comprises a variable frequency oscillator 240, such as a voltage controlled oscillator or a digitally controlled oscillator. The variable frequency oscillator 240 provides an oscillator signal at an output 260. The output 260 is coupled to an input of a divider 250 for dividing the oscillator signal. The division ratio of the divider 250 may be varied in response to a signal provided at an input 255 of the divider 250. The input 255 is a first modulation point for modulating the variable frequency oscillator 240 with a modulation signal. The divider 250 provides the divided and modulated oscillator signal at an output 252 which is coupled to a first input of a phase comparator 210. A second input 205 of the phase comparator 210 receives a reference signal generated by a reference oscillator (not illustrated), such as a crystal oscillator. The phase comparator 210 provides an error signal at an output which is coupled to an input of a filter 220. The error signal is indicative of the phase difference between the reference signal and the divided and modulated oscillator signal. The filtered error signal is coupled to a first input of a summing stage 230. A second input 233 of the summing stage 230 also receives a modulation signal (which may be the same modulation signal provided at 255 or a different modulation signal), and the summing stage provides the sum of the filtered error signal and the modulation signal at an output which is coupled to an input of the variable frequency oscillator 240 for controlling its frequency. The second input 233 of the summing stage 230 thus provides a second modulation point for modulating the variable frequency oscillator 240.

The summing stage 230 may be implemented in various ways. For example, for an analog phase locked loop it may sum voltages, and for a digital phase locked loop it may sum digital codes. A further possibility is for the inputs of the summing stage 230 to directly drive independent varicaps, or capacitor banks, in which case the resulting sum is the sum of capacitance values.

To compensate for variations in the gain of the variable frequency oscillator 240, the modulation signal may be scaled by a scaling stage 310 coupled to the second input 233 of the summing stage 230. The scaling stage 310 may be, for example, a variable gain amplifier or may be implemented in a digital processor. Thus as illustrated the modulation signal to be applied to the second modulation point is provided at an input 235 of the scaling stage 310, and the degree of scaling by the scaling stage 310 is determined by a scaling control signal coupled to a control input of the scaling stage 310. In FIG. 1 the scaling stage 310 is shown as separate from the calibrator 100 and the phase lock module 200, but in practice it may be incorporated into the calibrator 100 or into the phase lock module 200.

Turning now to the calibrator 100, it comprises a sign detector 10 having an input 12 for a modulation signal (which may be the same or a different modulation signal). The sign detector 10 provides at an output an indication of whether the modulation signal and the phase of the modulation signal have the same sign, relative to, respectively, a first threshold value and a second threshold value. An embodiment of the sign detector 10 is described in detail below.

The calibrator 100 also comprises a scaling controller 20 which has a first input 40 coupled to the output of the sign detector 10, and a second input 22 coupled to receive the error signal from the phase lock module 200. As illustrated in FIG. 1, the error signal may be provided to the input 22 from the output of the filter 220. Alternatively, the error signal may be provided to the input 22 from the input of the filter 220; in this case separate filtering may be provided for the error signal supplied to the input 22. The scaling controller 20 provides at an output 28 a scaling control signal, and the output 28 is coupled to the control input of the scaling stage 310. The scaling controller 20 is adapted to adjust the scaling control signal in response to the error signal, and is also adapted to adjust the scaling control signal only when the modulation signal and the phase of the modulation signal have the same sign, as indicated by the sign detector 10. An embodiment of the scaling controller 20 is described in detail below.

Before describing embodiments of the sign detector 10 and the scaling controller 20, the principles underlying the embodiments will be described. The error signal u(s) of a phase locked loop may be expressed as $$u(s) = \frac{1}{2\pi K_0} \cdot \frac{1-k}{1+\frac{1}{L(s)}} \cdot w_m(s) \quad (1)$$

where s is the Laplace operator, k is the oscillator gain, $K_0$ is a constant, L(s) is the open loop transfer function, and $w_m(s)$ is the modulation signal. Ideally, k=1, so 1−k represents the gain error. As an initial approximation, assume that L(s) is large, so that 1+1/L(s)≈1. Therefore, $$u(s) = \frac{1-k}{2\pi K_0} \cdot w_m(s)$$

If the error signal u(s) has the same sign as the modulation signal $w_m$, then the gain error 1−k is positive, which indicates that the oscillator gain is less than one, so it is too small. If the error signal u(s) has the opposite sign to the modulation signal $w_m$, then the gain error 1−k is negative, which indicates that the oscillator gain is greater than one, so it is too large. From equation (1)

sign(u)=sign(1−k).sign(w)

where the Laplace operator has been omitted because this is applicable in either the time domain or frequency domain. Thus it can be determined, from the sign of the error signal and the modulation signal, whether the gain is too small or too large by evaluating:

sign(u).sign(w)=sign(1−k).sign²(w) ie., sign(u).sign(w)=sign(1−k)   (2)

because $sign^2(w)=1$.

The approximation that L(s) is large is valid at low frequencies where the loop gain is high. However, at high frequencies where the loop gain is lower it is possible that the error signal is delayed by 90 degrees with respect to the modulation signal. In this case, multiplying signals that are 90 degrees apart results in a zero average, and not in a valid indication of gain error.

Figure 5A:
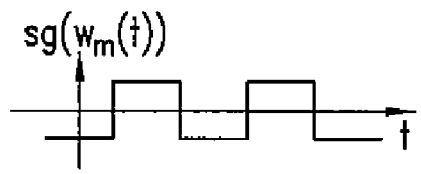
FIGS. 5A-5C is a diagram of waveforms without a phase shift.
Figure 5B:
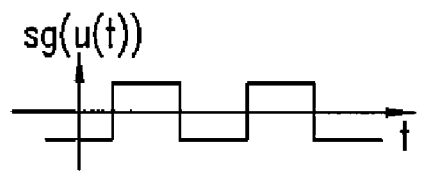
Figure 5C:
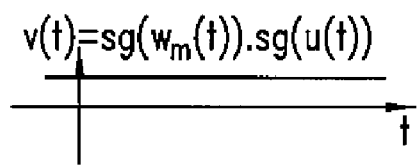
Figure 6A:
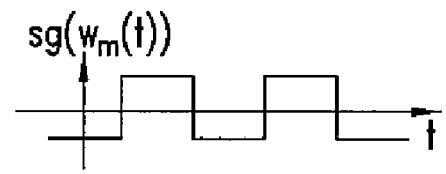
FIGS. 6A-6C is a diagram of waveforms with a phase shift.
Figure 6B:
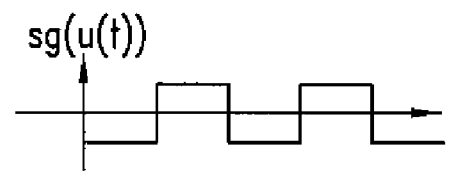
Figure 6C:
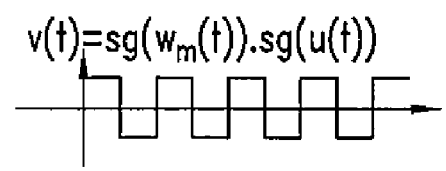
Figure 7A:
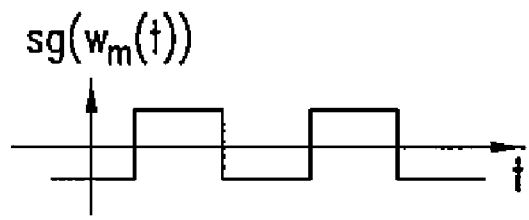
FIGS. 7A-7E is a diagram of waveforms when the phase of the modulation is employed.
Figure 7B:
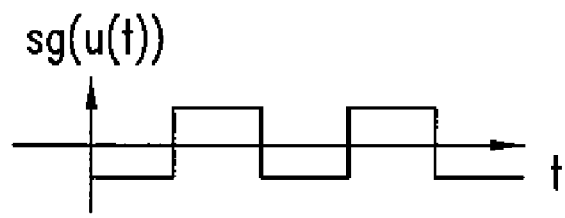
Figure 7C:
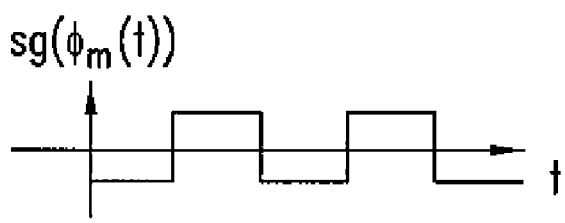
Figure 7D:
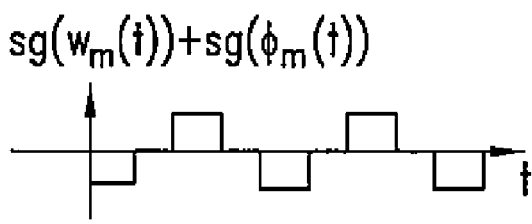
Figure 7E:
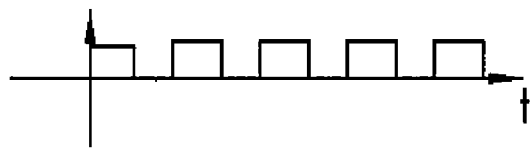

This problem is readily illustrated by means of waveform diagrams. In FIGS. 5, 6 and 7, "sg" is an abbreviation for the sign function, $w_m(t)$ represents the modulation signal as a function of time t, u(t) represents the error signal as a function of time, and $\phi_m(t)$ represents the phase of the modulation signal as a function of time. FIG. 5 illustrates a situation in which the modulation signal and the error signal are in-phase, resulting in the product v(t) of their signs being positive. Therefore, according to equation (2), the oscillator gain k is too small. FIG. 6 illustrates a situation in which the modulation signal and the error signal are 90 degrees out of phase, resulting in the product v(t) of their signs alternating between positive and negative values, and which if averaged would have a mean value of zero. Therefore, in this case a valid indication of whether k is too large or too small is not generated. As the phase difference approaches 90 degrees, the indication decreases to zero and so becomes progressively unreliable. If the phase difference approaches 180 degrees, the error signal changes sign and an erroneous indication of whether k is too large or too small is generated.

FIG. 7 illustrates a situation in which the modulation signal and the error signal are 90 degrees out of phase, but now the phase $\phi_m(t)$ of the modulation signal, shown in trace (c), is employed according to an embodiment. The waveforms of $sg(\phi_m(t))$ and $sg(w_m(t))$ may be visualized as cosine and sine waves which have been limited. Trace (d) illustrates the sum of the signs of the modulation signal and the phase of the modulation signal; where the sign of $w_m(t)$ and $\phi_m(t)$ is different, the sum is zero, and where these signs are the same, the sum is either positive or negative. Trace (e) illustrates the waveform of trace (d) multiplied by the sign of the error signal u(t). Now, despite the 90 degree phase shift between the modulation signal and the error signal, a positive signal is generated periodically, and this has a positive mean value. Corresponding examples can be generated for other phase shifts, which demonstrate that a non-zero mean value results which can be used for compensation of the oscillator gain, including a phase shift of around 180 degrees.

Thus, by employing the phase of the modulation signal according to an embodiment, a valid indication can be generated of whether the gain k of the oscillator is too small or too large, independent of phase shift between the modulation signal and the error signal, and thus independent of modulation frequency. In this way, an embodiment of a method is provided for assessing and adjusting the value of k which is independent of the frequency content of the modulation signal and independent of the phase response of the phase locked loop.

An embodiment of the sign detector 10 will now be described in more detail, with reference to FIG. 2. The sign detector 10 comprises a first comparator 15 coupled to the input 12 for comparing the modulation signal with the first threshold value, and for providing at an output of the comparator 15 a first sign signal indicative of whether the modulation signal is greater than or less than the first threshold. In an embodiment any DC component of the modulation signal is removed, in which case the first threshold value can be zero. The first sign signal provided at the output of the comparator 15 is a bipolar signal, and may have for example a value +1 or −1 according to whether the modulation signal is greater than or less than the first threshold.

Also coupled to the input 12 is a phase determination stage 16 for determining a phase signal indicative of the phase of the modulation signal. The phase determination stage 16 may be, for example, an integrator. Alternatively, the phase determination stage 16 may be omitted and the sign detector 10 supplied with the phase signal on a further input (not illustrated). An output of the phase determination stage 16, or alternatively the further input, is coupled to an input of a second comparator 19 for comparing the phase signal with the second threshold value, and for providing at an output of the comparator 19 a second sign signal indicative of whether the phase signal is greater than or less than the second threshold. In an embodiment any DC component of the phase signal may be removed, in which case the second threshold value can be zero. The second sign signal provided at the output of the comparator 19 is a bipolar signal, and may have for example a value +1 or −1 according to whether the phase signal is greater than or less than the second threshold.

The output of the first comparator 15 and the output of the second comparator 19 are coupled to respective inputs of a summer 11 which sums the first and second sign signals and provides at an output an indication of whether the first and second sign signals have the same sign, thereby providing an indication of whether the modulation signal and the phase of the modulation signal have the same sign relative to their respective first and second threshold values. If the first and second sign signals can both have values +1 and −1, the indication at the output of the summer 11 can have values +2, 0 and −2. The value zero occurs when the modulation signal and the phase of the modulation signal have the different signs, and the values +2 and −2 occur when modulation signal and the phase of the modulation signal have the same sign.

Figure 2:
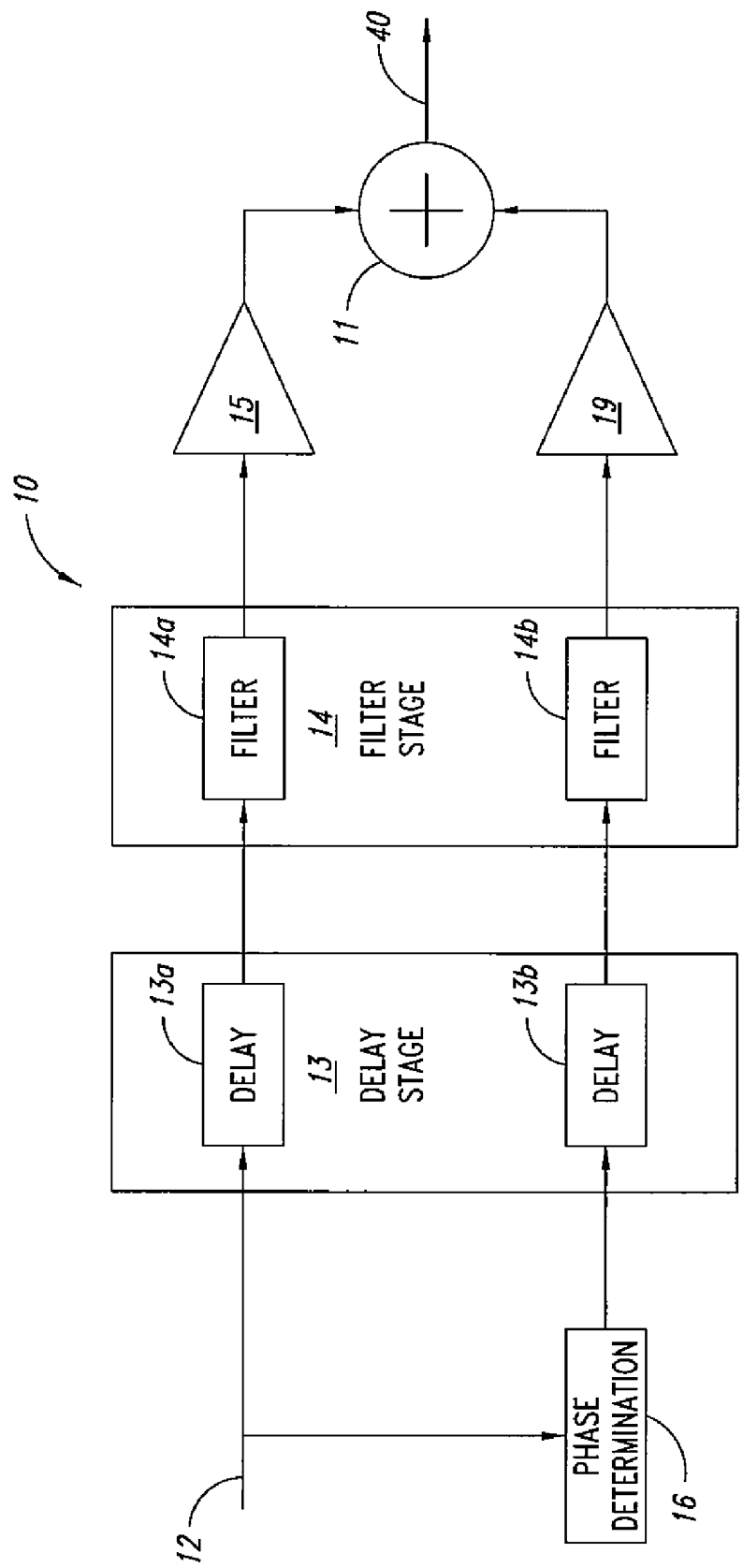
FIG. 2 is a block schematic diagram of a sign detector.

FIG. 2 also illustrates optional delay stages 13 and filters 14 which are described below.

Figure 3:
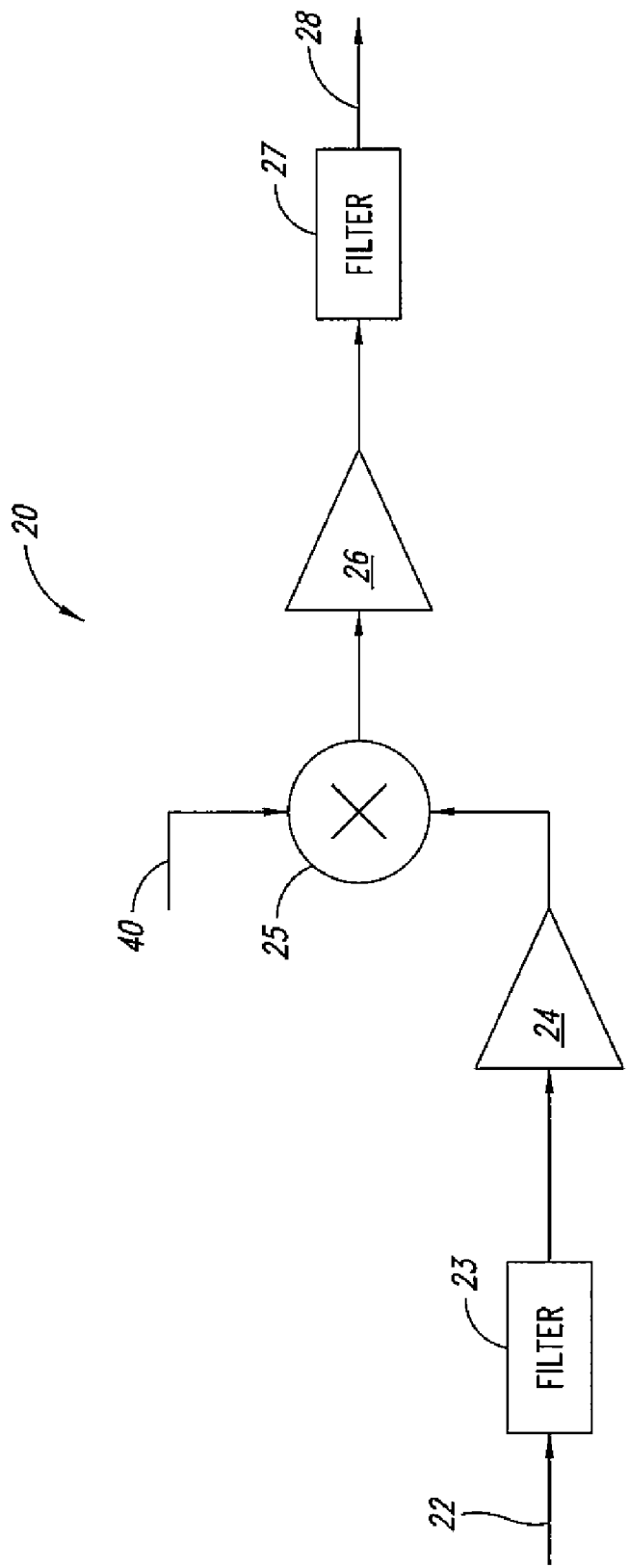
FIG. 3 is a block schematic diagram of a scaling controller.

An embodiment of the scaling controller 20 will now be described in more detail, with reference to FIG. 3. The scaling controller 20 comprises a third comparator 24 for comparing the error signal provided at the input 22 with a third threshold value, and for providing at an output of the comparator 24 a third sign signal indicative of whether the error signal is greater than or less than the third threshold. Preferably any DC component of the error signal is removed, in which case the third threshold value can be zero. The third sign signal provided at the output of the comparator 24 is a bipolar signal, and preferably has a value +1 or −1 according to whether the error signal is greater than or less than the third threshold.

The output of the comparator 24 is coupled to a first input of a multiplier 25, and the input 40 is coupled to a second input of the multiplier 25. The multiplier 25 multiplies the third sign signal by the indication of whether the modulation signal and the phase of the modulation signal have the same sign, which is provided at the output of the summer 11 of the sign detector 10. When the third sign signal can have values +1 and −1, and the indication provided at the output of the summer 11 can have the values +2, 0 and −2, the values resulting from multiplication by the multiplier 25 can have also the values +2, 0 and −2. The value zero occurs when the modulation signal and the phase of the modulation signal have the different signs, and the values +2 and −2 occur, dependent on the sign of the error signal, when modulation signal and the phase of the modulation signal have the same sign. The output of the multiplier 25 is coupled to the output 28 of the scaling control stage 20 via a first scaling stage 26, for example an amplifier, and a filter 27, which functions as an integrator, to provide the scaling control signal. While the output of the multiplier 25 provides a value of zero, the scaling control signal is also zero and so no adjustment is made, and the integrator holds the current value of the scaling control signal.

Optionally, the sign detector 10 may comprise an optional delay stage 13a and an optional filter 14a either or both of which may be coupled between the input 12 and the comparator 15 to delay and/or filter the modulation signal. Likewise, optionally a delay stage 13b and/or a filter 14b may be coupled between the phase determination stage 16 and the comparator 15 to delay and/or filter the phase signal. The delay stages 13a and 13b (together identified by reference numeral 13) and filters 14a and 14b (together identified by reference numeral 14) may be used to fully or partially compensate for unequal delays of signals in the calibrator 100 or phase lock module 200 and to reduce noise. In particular, the modulation signal may be delayed by a period equivalent to the delay between a change in the modulation signal and a consequent change in the error signal.

Alternatively, the delay stages 13a and 13b may be located after, respectively, the first and second comparators 15, 19, to delay the first and second bipolar signals. Also, the delay stages 13a and 13b may be omitted if the filters 14a and 14b provide any desired delay.

Optionally, the scaling controller 20 may comprise a filter 23 coupled between the input 22 and the comparator 24 for filtering the error signal to reduce noise. However, the filter 23 may introduce a delay which may lead to instability unless further precautions are taken. In this case, the filters 14a and 14b and/or the delay stages 13a and 13b may be arranged to provide a compensating delay for the modulation signal and the phase signal.

Figure 4:
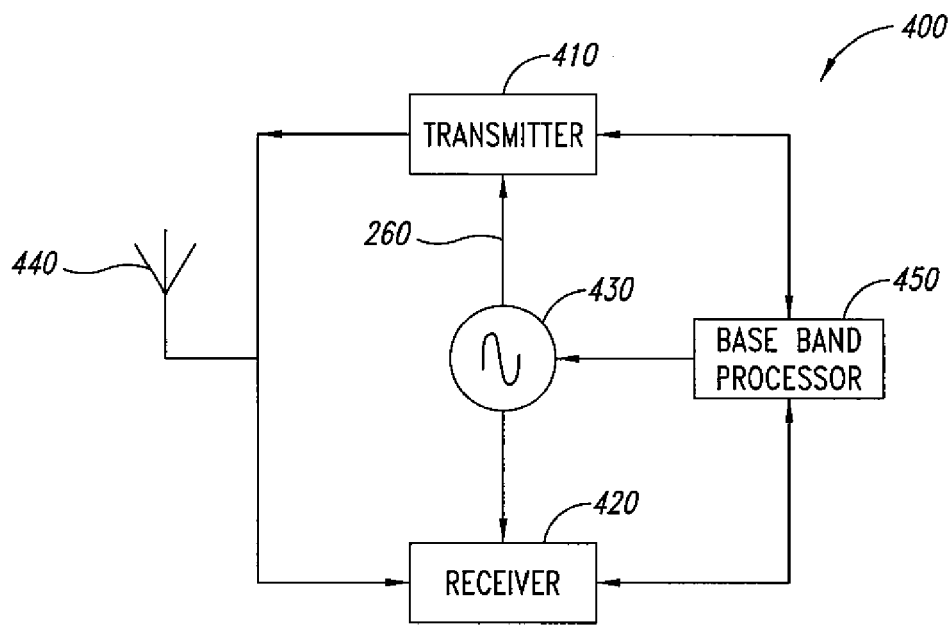
FIG. 4 is a block schematic diagram of a wireless communication device.

Referring to FIG. 4, there is illustrated a block schematic diagram of a wireless communication device 400, such as a mobile telephone, comprising a transmitter 410 and a receiver 420 coupled to an antenna 440. There is a frequency generator 430 which comprises an embodiment of a phase locked loop in accordance with the description herein, for example the phase locked loop 500 illustrated in FIG. 1, including the calibrator 100 and the phase locked loop module 200, and a reference oscillator (not illustrated) coupled to the input 205 of the phase lock module 200 for generating the reference signal. There is a baseband processor 450 coupled to frequency generator 430 for providing a modulation signal to the frequency generator 430, coupled to the transmitter 410 for controlling the transmitter, and coupled to the receiver 420 for controlling the receiver 420 and for processing received signals. The frequency generator 430 is coupled to the transmitter 410 via the output 260 for providing a modulated carrier signal for transmission, and to the receiver 420 for providing a local oscillator for use by the receiver 420.

Although embodiments have been described with reference to a phase locked loop which is equipped for two-point modulation, the calibrator 100 may also be used to calibrate a phase locked loop that employs single point modulation, or that is unmodulated for the majority of time, with the modulation being supplied only when calibration of the oscillator gain is desirable. Similarly, embodiments are not limited to use with a phase locked loop that comprises a divider, or specifically a divider having a variable division ratio.

The calibrator 100, and in particular the sign detector 10 and scaling controller 20, described above may be implemented in analog or digital hardware or in software stored in a memory medium and executed by a processor. Other embodiments of the sign detector 10 and scaling controller 20 may be used. For example, although embodiments of the sign detector 10 and the scaling controller 20 have been described which use bipolar signals, alternatively these elements may be designed to process signals of other types, in particular multilevel signals, analog signals, or monopolar signals.

In particular, the use of comparators 15, 19 and 24 that output binary values is not essential, but is merely an example implementation. Instead, any or all of the modulation signal, the phase signal, and the error signal may be processed as analog signals or multi-value digital signals. The indication at the output of the sign detector 10 of whether the modulation signal and the phase of the modulation signal have the same sign can have any form, such as an analog signal or a digital value, and need not be a three level signal as described in relation to the embodiment of FIG. 2.

Figure 8:
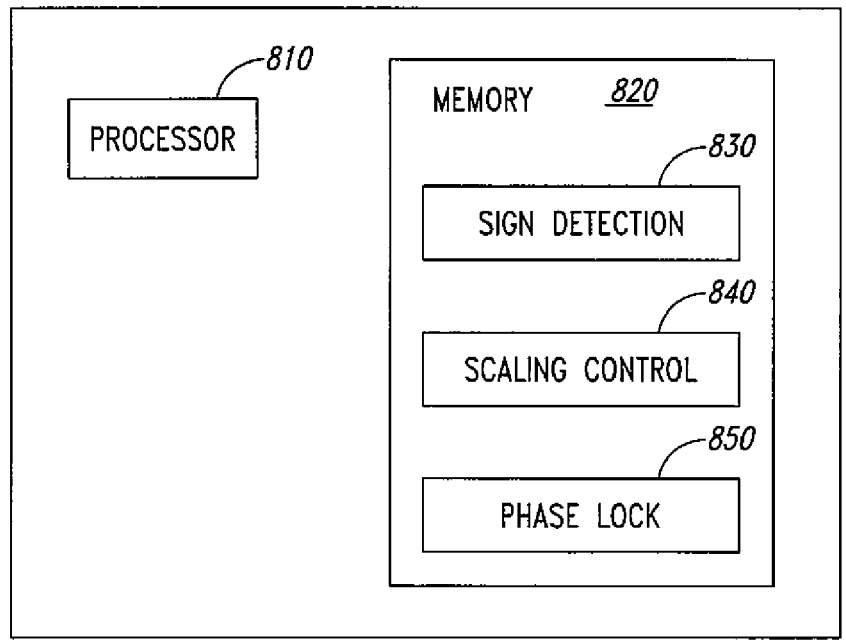
FIG. 8 illustrates an embodiment of a system implemented with a processor executing instructions stored in a memory.

FIG. 8 illustrates a system 800 having processor 810 and a memory 820. The processor 810 is configured to execute instructions stored in the memory 820. The instructions cause the processor 810 to perform one or more embodiments of the methods described herein. As illustrated, the instructions cause the processor to execute a sign detection module 830 and a scaling control module 840 and a phase lock module 850.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

The foregoing detailed description has set forth various embodiments of the devices and/or processes via the use of block diagrams and examples. Insofar as such block diagrams and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs executed by one or more computers (e.g., as one or more programs running on one or more computer systems), as one or more programs executed by on one or more controllers (e.g., microcontrollers) as one or more programs executed by one or more processors (e.g., microprocessors), as firmware, or as virtually any combination thereof, and that designing the circuitry and/or writing the code for the software and or firmware would be well within the skill of one of ordinary skill in the art in light of the teachings of this disclosure.

When logic is implemented as software and stored in memory, logic or information can be stored on any computer-readable medium for use by or in connection with any processor-related system or method. In the context of this disclosure, a memory is a computer-readable medium that is an electronic, magnetic, optical, or other physical device or means that contains or stores a computer and/or processor program. Logic and/or the information can be embodied in any computer-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "computer-readable medium" can be any element that can store the program associated with logic and/or information for use by or in connection with the instruction execution system, apparatus, and/or device. The computer-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), digital tape. Note that the computer-readable medium could even be paper or another suitable medium upon which the program associated with logic and/or information is printed, as the program can be electronically captured, via for instance optical scanning of the paper or other medium, then compiled, interpreted or otherwise processed in a suitable manner if necessary, and then stored in memory.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus to control a modulation signal for modulating a phase locked loop, the phase locked loop providing an error signal indicative of a phase error in the phase locked loop, the apparatus comprising:
a scaling controller configured to generate a scaling control signal dependent on the error signal for controlling scaling of the modulation signal; and
a sign detector configured to generate an indication of a sign of the modulation signal relative to a sign of a phase of the modulation signal;
wherein the scaling controller is adapted to adjust the scaling control signal in response to the indication.

2. The apparatus of claim 1 wherein the scaling controller is adapted to adjust the scaling control signal only when the modulation signal and the phase of the modulation signal have the same sign.

3. The apparatus of claim 1 wherein the sign detector comprises:
a first comparator configured to generate a first bipolar signal indicative of the sign of the modulation signal relative to a first threshold value;
a second comparator configured to generate a second bipolar signal indicative of the sign of the phase of the modulation signal relative to a second threshold value; and
a summer configured to generate the indication by summing the first bipolar signal and the second bipolar signal.

4. The apparatus of claim 1 wherein the sign detector comprises a phase determination stage configured to generate a phase signal indicative of the phase of the modulation signal.

5. The apparatus of claim 3 wherein the sign detector comprises a delay stage configured to delay at least one of the first bipolar signal and the second bipolar signal.

6. The apparatus of claim 1 wherein the sign detector comprises a first filter arranged to filter at least one of the modulation signal and a phase signal indicative of the phase of the modulation signal.

7. The apparatus of claim 1 wherein the scaling controller comprises:
a comparator configured to generate a bipolar signal indicative of the sign of the error signal relative to a threshold value; and
a multiplier configured to multiply the third bipolar signal by said indication.

8. The apparatus of claim 7 wherein the scaling controller comprises a first scaling stage coupled to an output of the multiplier and configured to control a magnitude of the scaling control signal.

9. The apparatus of claim 7 wherein the scaling controller comprises a filter coupled to an output of the first scaling stage.

10. The apparatus of claim 1 wherein the scaling controller comprises a second filter configured to filter the error signal.

11. The apparatus of claim 1, further comprising a scaling stage for scaling the modulation signal in response to the scaling control signal.

12. The apparatus of claim 1 wherein the indication indicates whether the sign of the modulation signal relative to a first threshold and the sign of the phase of the modulation signal relative to a second threshold are the same.

13. A phase locked loop, comprising:
 a calibrator having:
  a sign detector configured to generate an indication of a sign of a modulation signal relative to a sign of a phase of the modulation signal; and
  a scaling controller configured to generate a scaling control signal dependent on an error signal indicative of a phase error and adapted to adjust the scaling control signal in response to the indication;
 a variable frequency oscillator configured to generate an oscillator signal at an oscillator frequency;
 a phase comparator configured to generate the error signal indicative of a phase difference between the oscillator signal and a reference signal;
 a loop filter configured to provide a filtered error signal; and
 a coupling stage configured to couple the modulation signal, scaled in response to the scaling control signal, in combination with the filtered error signal to the variable frequency oscillator for controlling the oscillator frequency.

14. The phase locked loop of claim 13, further comprising a divider configured to divide the oscillator signal, and wherein the error signal is indicative of a phase difference between the divided oscillator signal and a reference signal.

15. The phase locked loop of claim 14, wherein the divider is adapted to divide the oscillator signal using a variable division ratio, and the divider comprises an input, the divider configured to vary the division ratio in response to the phase of the modulation signal.

16. The phase locked loop of claim 13 wherein the sign detector comprises:
 a first comparator configured to generate a first bipolar signal indicative of the sign of the modulation signal relative to a first threshold value;
 a second comparator configured to generate a second bipolar signal indicative of the sign of the phase of the modulation signal relative to a second threshold value;
 a summer configured to generate the indication by summing the first bipolar signal and the second bipolar signal; and
 a delay stage configured to compensate for a delay between a change in the modulation signal and a consequent change in the error signal.

17. A wireless communication device, comprising:
 a calibrator having:
  a sign detector configured to generate an indication of a sign of a modulation signal relative to a sign of a phase of the modulation signal; and
  a scaling controller configured to generate a scaling control signal dependent on an error signal indicative of a phase error and adapted to adjust the scaling control signal in response to the indication;
 a variable frequency oscillator configured to generate an oscillator signal at an oscillator frequency;
 a phase comparator configured to generate the error signal indicative of a phase difference between the oscillator signal and a reference signal;
 a loop filter configured to provide a filtered error signal; and
 a coupling stage configured to couple the modulation signal, scaled in response to the scaling control signal, in combination with the filtered error signal to the variable frequency oscillator for controlling the oscillator frequency.

18. A method for controlling a modulation signal for modulating a phase locked loop, the phase locked loop providing an error signal indicative of a phase error in the phase locked loop, the method comprising:
 generating a scaling control signal dependent on the error signal to controlling scaling of the modulation signal;
 generating an indication of a sign of the modulation signal relative to a sign of a phase of the modulation signal; and
 adjusting the scaling control signal in response to the indication.

19. The method of claim 18 wherein the scaling control signal is adjusted only when the modulation signal and the phase of the modulation signal have the same sign.

20. The method of claim 18 wherein generating the indication comprises determining whether the sign of the modulation signal relative to a first threshold and the sign of the phase of the modulation signal relative to a second threshold are the same.

21. A non-transitory computer readable memory medium comprising contents that cause a computing device to implement a method of modulating a phase lock loop, the method including:
 generating a scaling control signal dependent on an error signal indicative of a phase error in the phase lock loop to controlling scaling of a modulation signal;
 generating an indication of a sign of the modulation signal relative to a sign of a phase of the modulation signal; and
 adjusting the scaling control signal in response to the indication.

22. The non-transitory computer readable memory medium of claim 21 wherein the scaling control signal is adjusted only when the modulation signal and the phase of the modulation signal have the same sign.

23. The non-transitory computer readable memory medium of claim 21 wherein generating the indication comprises determining whether the sign of the modulation signal relative to a first threshold and the sign of the phase of the modulation signal relative to a second threshold are the same.

24. A system comprising:
 means for generating a scaling control signal dependent on an error signal indicative of a phase error in a phase lock loop to controlling scaling of a modulation signal;
 means for generating an indication of a sign of the modulation signal relative to a sign of a phase of the modulation signal; and
 means for adjusting the scaling control signal in response to the indication.

25. The system of claim 24 wherein the means for adjusting is configured to adjust the scaling control signal only when the modulation signal and the phase of the modulation signal have the same sign.

26. The system of claim 24 wherein the means for generating the indication is configured to determine whether the sign of the modulation signal relative to a first threshold and the sign of the phase of the modulation signal relative to a second threshold are the same.

* * * * *